(12) United States Patent
Rosewarne

(10) Patent No.: US 11,313,106 B2
(45) Date of Patent: Apr. 26, 2022

(54) ELECTRICAL PROTECTION APPARATUS

(71) Applicant: PROTECTIVE INNOVATIONS PTY LTD, Malaga (AU)

(72) Inventor: Karl Robert Rosewarne, Malaga (AU)

( * ) Notice: Subject to any disclaimer, the term of this patent is extended or adjusted under 35 U.S.C. 154(b) by 169 days.

(21) Appl. No.: 16/764,863

(22) PCT Filed: Nov. 15, 2018

(86) PCT No.: PCT/AU2018/051218
§ 371 (c)(1),
(2) Date: May 17, 2020

(87) PCT Pub. No.: WO2019/095008
PCT Pub. Date: May 23, 2019

(65) Prior Publication Data
US 2020/0340212 A1    Oct. 29, 2020

(30) Foreign Application Priority Data

Nov. 17, 2017 (AU) .................................. 2017904669

(51) Int. Cl.
| | |
|---|---|
| *E02F 9/24* | (2006.01) |
| *E02F 9/26* | (2006.01) |
| *B60Q 9/00* | (2006.01) |
| *B60W 50/04* | (2006.01) |
| *B60W 50/14* | (2020.01) |
| *B60Q 5/00* | (2006.01) |

(Continued)

(52) U.S. Cl.
CPC .............. *E02F 9/245* (2013.01); *B60Q 5/005* (2013.01); *B60Q 9/008* (2013.01); *B60W 50/045* (2013.01); *B60W 50/14* (2013.01); *E02F 9/2041* (2013.01); *E02F 9/26* (2013.01); *G01R 29/085* (2013.01); *G05D 1/0022* (2013.01); *G07C 5/085* (2013.01); *B60W 2050/143* (2013.01); *B66F 17/003* (2013.01); *B66F 17/006* (2013.01)

(58) Field of Classification Search
None
See application file for complete search history.

(56) References Cited

U.S. PATENT DOCUMENTS

| | | |
|---|---|---|
| 2013/0033258 A1 | 2/2013 | Parr et al. |
| 2014/0184425 A1 | 7/2014 | Smith et al. |

FOREIGN PATENT DOCUMENTS

| | | |
|---|---|---|
| WO | 2008102225 A2 | 8/2008 |

*Primary Examiner* — Abdhesh K Jha
(74) *Attorney, Agent, or Firm* — Michael J. Feigin, Esq.; Feigin and Fridman LLC

(57) ABSTRACT

Provided is electrical protection apparatus for operative fitment to a portion of the machinery operable near an electrical conductor and to generate a signal via electromagnetic induction. Also included is a signal isolator configured to electrically isolate the sensor. Also included is a controller arranged in signal communication with the isolator. The controller is configured to monitor the signal and to: i) record a log of movement commands executed by the control system; ii) if the signal reaches a predetermined threshold, override the control system so that the portion of the machinery is only maneuverable to reduce the signal below the predetermined threshold; iii) if the signal exceeds the predetermined threshold, override the control system and execute the most recent movement commands in reverse to automatically manoeuvre the portion of the machinery away from the conductor; and iv) if the signal reaches and/or exceeds the predetermined threshold, activate the indicator.

19 Claims, 3 Drawing Sheets

(51) Int. Cl.
*E02F 9/20* (2006.01)
*G01R 29/08* (2006.01)
*G05D 1/00* (2006.01)
*G07C 5/08* (2006.01)
*B66F 17/00* (2006.01)

ELECTRICAL PROTECTION APPARATUS

TECHNICAL FIELD

This invention relates to electrical protection apparatus for mobile machinery and associated mobile machinery including such electrical protection apparatus, as well as a method for operating mobile machinery.

BACKGROUND ART

The following discussion of the background art is intended to facilitate an understanding of the present invention only. The discussion is not an acknowledgement or admission that any of the material referred to is or was part of the common general knowledge as at the priority date of the application.

The need for protecting mobile machinery operating near electrical conductors is known in the art of electrical engineering. Mobile machinery is particularly problematic, where so-called 'inattention blindness' can be present, where an operator of the machinery is focused on a specific work task and becomes temporarily 'blind' to what is going on around them. Coming into contact with overhead power lines is one of the largest causes of fatalities associated with mobile machinery.

When a machine contacts a bare, overhead power-line conductor, the frame becomes energized to approximately line-to-ground voltage, often ranging from several hundred to more than 100,000 volts. Various possible scenarios can lead to injury under this circumstance. In one, workers guiding a suspended load, or otherwise in direct contact with both the machine and ground, immediately become a path for electric current. In another, equipment operators are not aware of the line contact, or may perceive themselves to be in immediate danger and attempt to dismount the equipment, simultaneously bridging the high voltage between the equipment and ground.

For this reason, some prior art solutions exist to try and prevent accidental contact between machinery and electrical conductors. For example, in U.S. Pat. No. 6,170,607 there is described a warning system for an aerial device which provides an alarm signal when a worker on an aerial work platform is exposed to an electrical hazard. The aerial device has an insulated boom which carries the work platform on its upper end. An electrostatic charge is introduced to all conductive components near the platform. The electrostatic charge is harmless to the worker and dissipates upon contact with an energized power line or grounded object. The absence of charge is then sensed by a warning device which provides an alarm signal. However, as with most of the prior art solutions, this system provides alarm after unwanted electrical contact, which does not serve to prevent contact with conductors and protect from injuries or fatalities.

Similarly, US Publication No. 2013/0033258 discloses an electric field monitoring system for use with a crane and having a plurality of electric field sensors and a monitoring system base unit. The sensors can be installed along the length of a crane boom and the system can detect the presence of an electrical field proximate the boom in order to alert an operator when a safe threshold is exceeded. The system can also shut off the crane control system when detecting an electrical field, whereafter an operator may bypass the system to allow continued movement, allowing for potentially dangerous operator error.

The current invention was conceived with these shortcomings in mind.

SUMMARY OF THE INVENTION

It is to be appreciated by the skilled addressee that reference herein to mobile machinery includes reference to construction machinery, material handling machinery and/or agricultural machinery for performing specific tasks, non-limiting examples of which include excavators, loaders, bulldozers, backhoes, dump trucks, cranes, drills, concrete pumps, forklifts, elevated work platforms, etc. In particular, mobile machinery as referenced herein includes machinery having constituent parts that may operate near and/or come into contact with electrical conductors typically used in power distribution and/or reticulation systems, such as overhead power lines and underground electrical cables.

According to a first aspect of the invention there is provided electrical protection apparatus for mobile machinery, said apparatus comprising:

a sensor configured for operative fitment to a portion of the machinery operable near an electrical conductor and to generate a signal via electromagnetic induction from electricity in the conductor;

a signal isolator configured to electrically isolate the sensor;

an indicator configured to indicate when the signal reaches and/or exceeds a predetermined threshold; and a controller arranged in signal communication with the isolator and operatively interfaced with a control system of the machinery, the controller configured to monitor the signal and to:

i) record a log of movement commands executed by the control system;

ii) if the signal reaches a predetermined threshold, override the control system so that the portion of the machinery is only maneuverable to reduce the signal below the predetermined threshold;

iii) if the signal exceeds the predetermined threshold, override the control system and execute the most recent movement commands in reverse to automatically manoeuvre the portion of the machinery away from the conductor; and iv) if the signal reaches and/or exceeds the predetermined threshold, activate the indicator.

The skilled addressee is to appreciate that the most recent movement commands are typically indicative of movements that placed the portion of the machinery in proximity to the electrical conductor which may lead to the predetermined threshold being exceeded. As such, automatically performing such recorded movements in reverse will generally safely manoeuvre the portion of machinery away from said conductor.

In one example, the sensor is configured for operative fitment to a portion of the machinery by comprising a suitable waveguide for attachment along a length of the portion.

In a further example, the waveguide comprises the portion of the machinery.

Typically, the sensor includes a filtering circuit to generate the signal based on electromagnetic induction in a frequency range of 45 Hz to 65 Hz to minimise electromagnetic induction interference in other frequency ranges.

Typically, the signal isolator includes an optical isolator or optical diode to electrically isolate the sensor from the controller.

Typically, the indicator comprises a visual indicator for providing a visual indication of the alarm condition, e.g. a warning light.

Typically, the indicator comprises an audio indicator for providing an audible indication of the alarm condition, i.e. an audio emitter for emitting sound.

Typically, the indicator is configured to provide a graded indication of the alarm condition.

Accordingly, the alarm condition may be graded from a caution state to a warning state and a critical state, each state determined by the signal's relationship to the predetermined threshold.

Typically, the controller comprises a network interface operatively configured to transmit an alarm signal via a communications network if the signal reaches and/or exceeds the predetermined threshold.

Accordingly, in one embodiment, the indicator may comprise a suitable transmitter for transmitting an alarm signal if the signal reaches and/or exceeds the predetermined threshold.

Typically, the controller is programmable to configure the predetermined threshold.

In one example, the apparatus includes and/or is configured to communicate with a wireless status monitor which is configured to provide indication on an operational status of said apparatus.

In one example, the status monitor is configured to interface with the controller to allow remote maneuvering of the portion of the machinery.

According to a second aspect of the invention there is provided mobile machinery having a portion operable near an electrical conductor, said machinery comprising:

a sensor configured for operative fitment to a portion of the machinery operable near an electrical conductor and to generate a signal via electromagnetic induction from electricity in the conductor;

a signal isolator configured to electrically isolate the sensor;

an indicator configured to indicate when the signal reaches and/or exceeds a predetermined threshold; and a controller arranged in signal communication with the isolator and operatively interfaced with a control system of the machinery, the controller configured to monitor the signal and to:

i) record a log of movement commands executed by the control system;

ii) if the signal reaches a predetermined threshold, override the control system so that the portion of the machinery is only maneuverable to reduce the signal below the predetermined threshold;

iii) if the signal exceeds the predetermined threshold, override the control system and execute the most recent movement commands in reverse to automatically manoeuvre the portion of the machinery away from the conductor; and iv) if the signal reaches and/or exceeds the predetermined threshold, activate the indicator.

In one example, the portion operable near the conductor is selected from a group consisting of a ground engaging tool, an elevated work platform, and a boom.

In a further example, the waveguide comprises the portion of the machinery.

Typically, the sensor includes a filtering circuit to generate the signal based on electromagnetic induction in a frequency range of 45 Hz to 65 Hz to minimise electromagnetic induction interference in other frequency ranges.

Typically, the signal isolator includes an optical isolator or optical diode to electrically isolate the sensor from the controller.

Typically, the indicator comprises a visual indicator for providing a visual indication of the alarm condition.

Typically, the indicator comprises an audio indicator for providing an audible indication of the alarm condition, i.e. an audio emitter for emitting sound.

Typically, the indicator is configured to provide a graded indication of the alarm condition.

Accordingly, the alarm condition may be graded from a caution state to a warning state and a critical state, each state determined by the signal's relationship to the predetermined threshold.

Typically, the controller comprises a network interface operatively configured to transmit an alarm signal via a communications network if the signal reaches and/or exceeds the predetermined threshold.

Accordingly, in one embodiment, the indicator may comprise a suitable transmitter for transmitting an alarm signal if the signal reaches and/or exceeds the predetermined threshold.

Typically, the controller is programmable to configure the predetermined threshold.

In one example, the controller includes and/or is configured to communicate with a wireless status monitor which is configured to provide indication on an operational status of said mobile machinery.

In one example, the status monitor is configured to interface with the controller to allow remote maneuvering of the portion of the machinery.

According to a third aspect of the invention there is provided a method for operating mobile machinery, said method comprising the steps of:

generating a signal via a sensor configured for operative fitment to a portion of the machinery operable near an electrical conductor, said signal generated via electromagnetic induction from electricity in the conductor; and via a controller operatively interfaced with a control system of the machinery:

i) monitoring the signal and recording a log of movement commands executed by the control system;

ii) if the signal reaches a predetermined threshold, overriding the control system so that the portion of the machinery is only maneuverable to reduce the signal below the predetermined threshold; and iii) if the signal exceeds the predetermined threshold, overriding the control system and executing the most recent movement commands in reverse to automatically manoeuvre the portion of the machinery away from the conductor.

Typically, the method includes the step of, via the controller, activating an indicator configured to indicate when the signal reaches and/or exceeds a predetermined threshold.

In one example, the method includes the step of, via the controller, transmitting an alarm signal via a communications network if the signal reaches and/or exceeds the predetermined threshold.

BRIEF DESCRIPTION OF THE DRAWINGS

The description will be made with reference to the accompanying drawings in which.

DETAILED DESCRIPTION OF EMBODIMENTS

Figure 1:
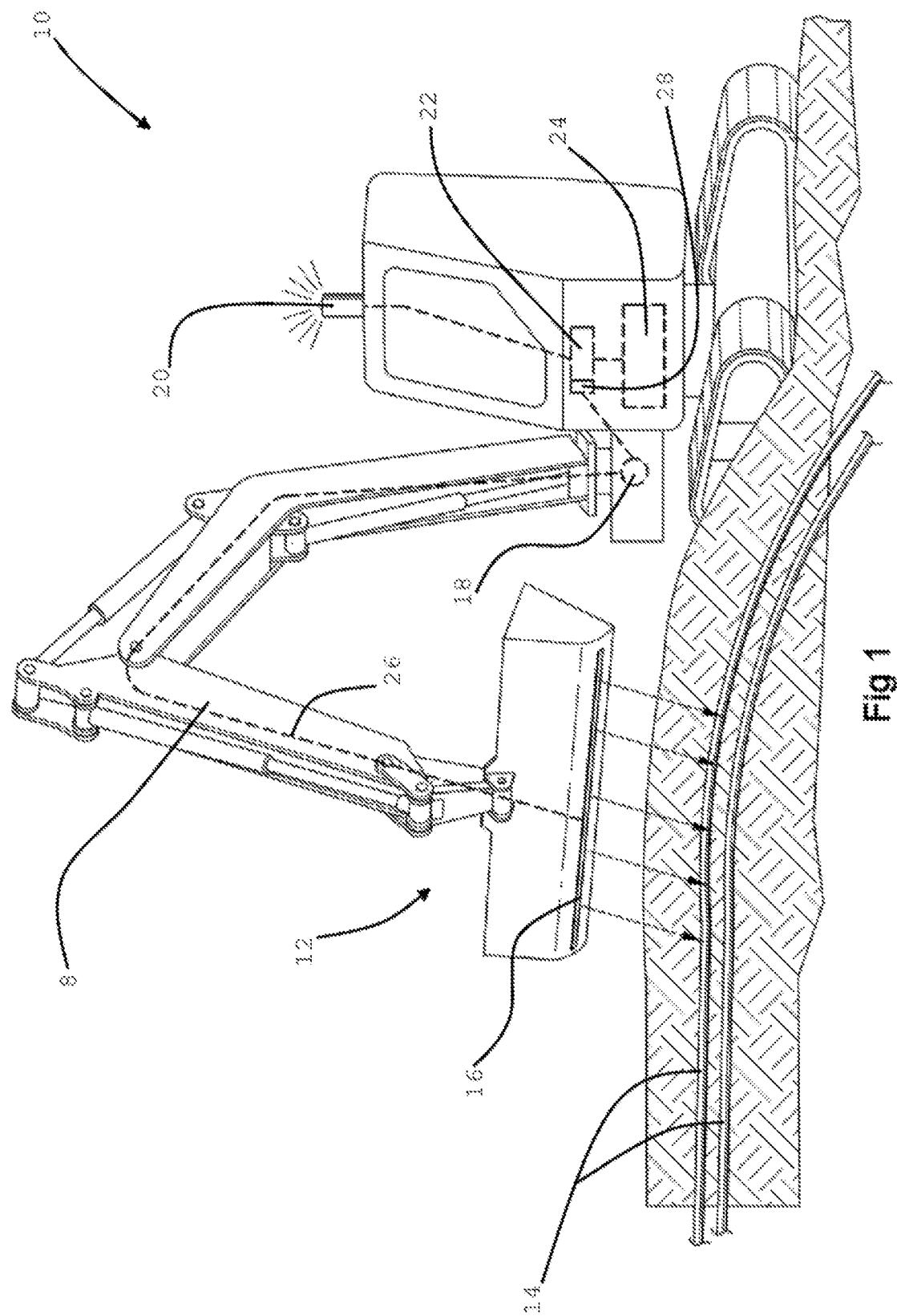
FIG. 1 is a diagrammatic perspective view representation of one embodiment of electrical protection apparatus in accordance with an aspect of the invention.

Further features of the present invention are more fully described in the following description of several non-limiting embodiments thereof. This description is included solely for the purposes of exemplifying the present invention to the skilled addressee. It should not be understood as a restriction on the broad summary, disclosure or description of the invention as set out above. In the figures, incorporated to illustrate features of the example embodiment or embodiments, like reference numerals are used to identify like parts throughout.

With reference now to the accompanying figures, there are shown examples of electrical protection apparatus 10 for mobile machinery 8. As described above, such reference to mobile machinery includes reference to construction machinery, material handling machinery and/or agricultural machinery for performing specific tasks. In FIG. 1, the apparatus 10 is incorporated into an excavator and in FIG. 2, the apparatus 10 is incorporated into a mobile elevated work platform, also referred to as a cherry-picker or a bucket truck.

A primary goal of the present invention is the protection of mobile machinery 8 operating near electrical conductors 14. In the exemplified embodiments, such electrical conductors 14 can include buried electrical cables 14 shown in FIG. 1, or overhead power lines 14 shown in FIG. 2.

Figure 2:
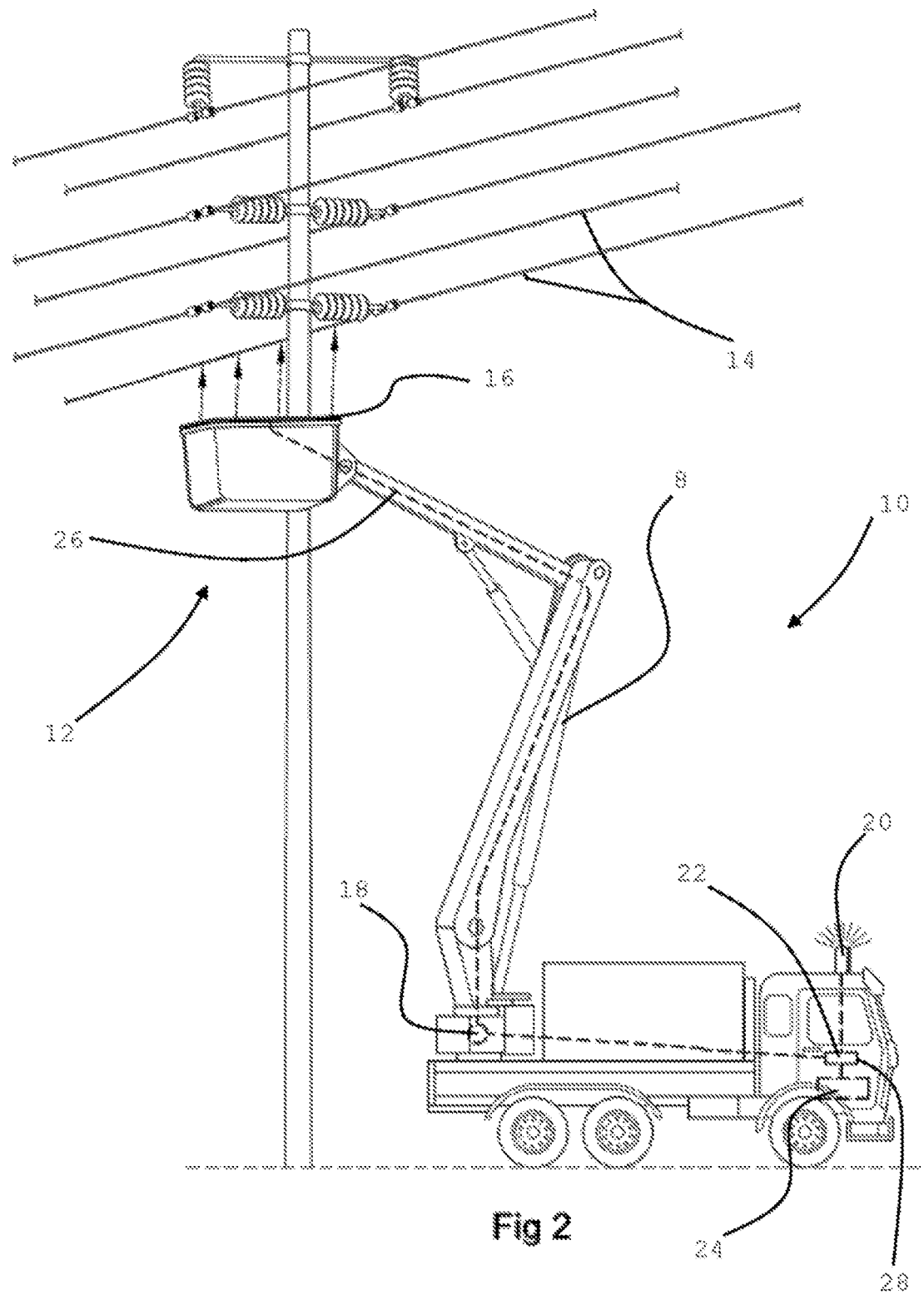
FIG. 2 is a diagrammatic side view representation of a further embodiment of the electrical protection apparatus.
Figure 3:
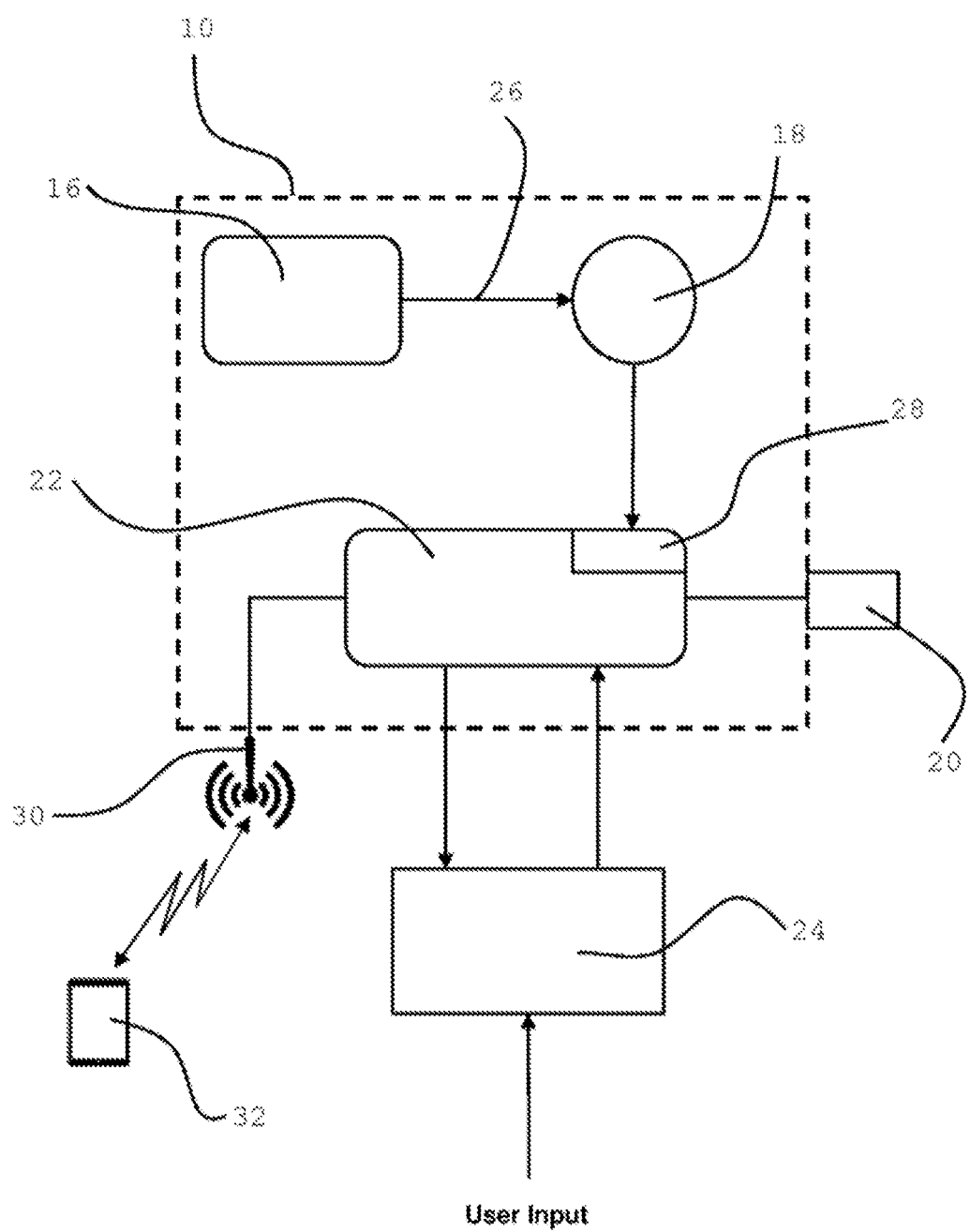
FIG. 3 is diagrammatic overview representation of the electrical protection apparatus of FIGS. 1 and 2.

In general, and with reference to FIG. 2, the apparatus 10 typically comprises a sensor 16, a signal isolator 18, a controller 22, and a suitable indicator 20. The features of these components are described in more detail below.

The sensor 16 is typically configured for operative fitment to a portion 12 of the machinery 8 which is operable near the electrical conductor 14. In the example of FIG. 1, this portion 12 may include the excavator bucket or similar ground engaging tools. In the example of FIG. 2, the portion may include the bucket of elevated work platform. The skilled addressee will further appreciate that other portions of the machinery 8 may also include or incorporate the sensor 16, such as a boom arm, a cabin, or even the machinery 8 entirely.

Accordingly, in one example, the sensor 16 is configured for operative fitment to a portion 12 of the machinery 8 by comprising a suitable waveguide 26 for attachment along a length of the portion 12, e.g. the entire boom arm may include a suitable waveguide or antenna 26, or the like. In a yet further example, the waveguide 26 may comprise the actual portion 12 of the machinery 8 where such a portion is suitably conductive, for example. Various configurations are possible and within the scope of the present invention.

The sensor 16 is generally configured to operatively generate a signal via electromagnetic induction from electricity in the conductor 14, as indicated by the arrow in FIGS. 1 and 2. Such electromagnetic induction principles are well known in the art of electrical engineering and will not be described in detail herein.

In a typical example, the apparatus 10 also includes a filtering circuit 28 (indicated as part of the controller 22 in the exemplified embodiments, but such filtering circuit 28 may be incorporated into the sensor 16 or the signal isolator 18, for example). This filtering circuit 28 is configured to allow the sensor 16 to generate the signal based on electromagnetic induction in a frequency range of 45 Hz to 65 Hz to minimise electromagnetic induction interference in other frequency ranges. Most large-scale electrical generation schemes operate at a frequency of either 50 Hz or 60 Hz and the filtering circuit 28 may be configured to filter electromagnetic signals outside these frequencies to minimise interference. Such filtering circuit technology can also be utilised in sensing circuits for other applications, such as standalone electrical field sensors. In this manner, intelligent frequency-specific 50 hz and 60 hz monitoring with 5% tolerance can be achieved to eliminate false triggering.

The apparatus 10 also includes a signal isolator 18 which is generally configured to electrically isolate the sensor 16. Typically, the signal isolator 18 includes an optical isolator 18 or optical diode to electrically isolate the sensor 16 from the controller 22. The skilled addressee will appreciate that such an optical isolator ensures high level electronic separation where there is no direct electrical connection between the sensor 16 and other components of the apparatus 10.

Apparatus 10 further includes an indicator 20 which is configured to indicate when the signal reaches and/or exceeds a predetermined threshold, i.e. an alarm condition. Typically, the indicator 20 comprises a visual indicator 20 for providing a visual indication of the alarm condition, e.g. a warning light, or the like. Similarly, the indicator 20 may also comprise an audio indicator 20 for providing an audible indication of the alarm condition, i.e. an audio emitter for emitting sound.

In certain examples, the indicator 20 is configured to provide a graded indication of the alarm condition. For example, the alarm condition may be graded from a caution state to a warning state and a critical state, each state determined by the signal's relationship to the predetermined threshold. Such states may be indicated by different colours via a visual indicator 20, e.g. a green light, an orange light, a red light. Similarly, such states may be indicated by different tones via an audible alarm, e.g. intermittent beeps, followed by a high-pitched alarm, etc. It is to be appreciated that, in one embodiment, the indicator 20 may also comprise a suitable transmitter for transmitting an alarm signal if the signal reaches and/or exceeds the predetermined threshold.

The apparatus 10 also includes the controller 22 which is generally arranged in signal communication with the isolator 18 and operatively interfaced with an existing control system 24 of the machinery 8. Such control systems 24 are well-known in the prior art and typically comprise microcontroller or PLC-based hydraulic and/or pneumatic control systems for operating the machinery 8. As will be readily understood by the skilled addressee, the controller 22 typically comprises any suitable processor configured to perform logical and arithmetical operations on a suitable instruction set.

Importantly, the controller 22 is configured to monitor the signal and to i) record a log of movement commands executed by the control system 24, typically upon receiving suitable user input, ii) if the signal reaches a predetermined threshold, override the control system 24 so that the portion 12 of the machinery 8 is only maneuverable to reduce the signal below the predetermined threshold, and iii) if the signal exceeds the predetermined threshold, override the control system 24 and execute the most recent movement commands in reverse to automatically manoeuvre the portion 12 of the machinery 8 away from the conductor 14. In addition, if the signal reaches and/or exceeds the predetermined threshold, the controller 22 generally activates the indicator 20.

For example, in this manner the predetermined threshold can be configured for two different thresholds, such as an 'exclusion zone detection' threshold when the predetermined threshold is reached, and a 'potential electrical contact detection' threshold when the predetermined threshold is exceeded. In particular, controller 22 is typically configured record or log details of each so-called 'detection event' where the signal reaches/exceeds the predetermined threshold and to store such event for one month, a time and date of the detection event, the motion of the machinery 8 that was active at the time of the detection even, as well as the motions that are activated during the active detection time.

It is believed to be particularly advantageous that the controller 22 is configured to log the movement commands and can override the control system 24 when a dangerous signal is sensed by the sensor 16. For example, when the portion 12 of the machinery 8 comes within a certain distance of the electrical conductor 14, the controller 22 will only allow control system 24 movements that move the portion 12 away from the electrical conductor 14, i.e. the signal reduces relative to the predetermined threshold, or the like.

Similarly, should the signal exceed the predetermined threshold, e.g. indicative of the portion perhaps touching the electrical conductor 14 for whatever reason, the controller 22 will automatically override the control system 24 and move the portion 12 away from the electrical conductor 14. Logically, the log of movements is assumed to provide a verified and safe movement path which will lead the portion 12 to a safe position away from the electrical conductor 14 under normal circumstances. In the very least, such retracing of the log of movements should bring an operator on an elevated work platform, who may be incapacitated through electrical shock, within easier reach of emergency responders, i.e. a return-to-home functionality.

For example, Hiab™ is a well-known manufacturer of mobile machinery controllers and control systems. In an embodiment using a Hiab™ controller with the following I/O configuration:

| Input/output & control configuration | Full motion forward | Neutral | Full motion reverse |
| --- | --- | --- | --- |
| Input 1 - Slew control | 0 V | 2.5 V | 5 V |
| Input 2 - lower hoist | 0 V | 2.5 V | 5 V |
| Input 3 - Upper hoist | 0 V | 2.5 V | 5 V |
| Input 4 - Boom extension | 0 V | 2.5 V | 5 V |
| Input 5 - Sensor detection | Corresponding active input direction (forward or reverse) at the time is logged ('offending input' until the detection in input 5 is no longer energised) | | |
| Output 1 - E-stop control | On when system running normally; Off when shutdown activated; E-stop control operates a Normally Open relay in series with the E-STOP controls, stopping motion when open. | | |

Operation may be configured as follows: in normal operation, Output 1 is energised. When a detection in input 5 is registered, the corresponding active input direction (forward or reverse) at the time is logged and referred to as the offending input until the detection in input 5 is no longer energised.

During the detection time, whenever the offending input is engaged the e-stop control is de-energised, stopping the hydraulic operation of the machine. Similarly, when any other motion is engaged during the detection time other than the motion complementary to the offending input, the e-stop control output is engaged. During the detection time, when no inputs are activated, the e-stop control is energised allowing the operation of the machine hydraulics. Operating the complementary control to the offending input does not operate the E-stop output, allowing this motion direction only to be operated (away from the hazard). Upon de-energisation of input 5, the system returns to normal operation.

In one embodiment, the controller 22 also comprises a network interface 30 operatively configured to transmit an alarm signal via a communications network if the signal reaches and/or exceeds the predetermined threshold. For example, a radio transmitter, a GSM or similar transmitter, or the like, can be used to alert a third party that the signal has reached and/or exceeded the predetermined threshold, i.e. a call for help. Another example may feature a CAN bus interface module, or the like. Accordingly, in one embodiment, the indicator 20 may comprise a suitable transmitter or the network interface 30 for transmitting an alarm signal if the signal reaches and/or exceeds the predetermined threshold.

The skilled addressee will also appreciate that the controller 22 is typically programmable to configure the predetermined threshold, i.e. calibrate the apparatus 10 to set the predetermined threshold according to requirements, local legislation or environmental conditions, etc.

In one example, the sensor 16 comprises a suitable sensor module or plurality of such modules operating wirelessly, with a custom low output 900 MHz and 2.4 GHz range, each module being frequency selectable at a programming level, along with a low-output 40 m range which generally does not require a transmission licence or permit to operate. Each sensor module comprising sensor 16 typically includes sensor status monitoring with alert functionality, sensor failure alert, sensor charge fail alert, sensor wireless link fail alert, sensor battery low voltage alert, an onboard solar charging system, such as a 5V 160 ma solar panel, along with suitable electrochemical cells, e.g. dual Panasonic™ li-ion 18650 3500 mah cells connected in parallel, as well as an intelligent battery monitoring and charging circuit. For example, sensor 16 may be motion-activated, i.e. the sensor 16 switches off or enters a low-power state when the mobile machinery 8 stops moving for a programmable period of time in order to save power, and switches back on immediately when the machinery 8 moves again.

Similarly, the controller 22 comprises a 12ch 24-motion control board with output module, along with solid state relays used for all outputs to interrupt the feed to control solenoids, as well as onboard input voltage regulation at 12 volts and 24 volts, outputs for external audible and visual alert, high intensity LED two-stage green and red status lights, and an audible 90 db alert siren.

In one example, the controller 22 includes and/or is configured to communicate with a wireless status monitor 32 which is configured to provide indication on an operational status of said mobile machinery 8 and/or controller 22. In one example, the status monitor 32 is configured to interface with the controller 22 to allow remote maneuvering of the portion 12 of the machinery 8. In one example, the remote status monitor 32 is typically a pocket-sized audible and visual device which utilises the same wireless communication protocols as the rest of the apparatus 10, such as a tablet computer or the like.

The skilled addressee will further appreciate that the present invention provides for any mobile machinery 8 which includes the apparatus 10, as described above.

In addition, the present invention also provides for a method for operating mobile machinery 8. The method generally comprises the steps of generating the signal via the sensor 16, which is configured for operative fitment to the portion 12, and via the controller 22 i) monitoring the signal and recording the log of movement commands executed by the control system 24, ii) if the signal reaches the predetermined threshold, overriding the control system 24 so that the portion 12 of the machinery 8 is only maneuverable to reduce the signal below the predetermined threshold, and iii) if the signal exceeds the predetermined threshold, overriding the control system 24 and executing the most recent movement commands in reverse to automatically manoeuvre the portion 12 of the machinery 8 away from the conductor 14.

Typically, the method includes the step of, via the controller 22, activating the indicator 20 configured to indicate when the signal reaches and/or exceeds a predetermined threshold. Similarly, in one example, the method includes the step of, via the controller 22, transmitting an alarm signal via a communications network if the signal reaches and/or exceeds the predetermined threshold.

Optional embodiments of the present invention may also be said to broadly consist in the parts, elements and features referred to or indicated herein, individually or collectively, in any or all combinations of two or more of the parts, elements or features, and wherein specific integers are mentioned herein which have known equivalents in the art to which the invention relates, such known equivalents are deemed to be incorporated herein as if individually set forth. In the example embodiments, well-known processes, well-known device structures, and well-known technologies are not described in detail, as such will be readily understood by the skilled addressee.

The use of the terms "a", "an", "said", "the", and/or similar referents in the context of describing various embodiments (especially in the context of the claimed subject matter) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. As used herein, the term "and/or" includes any and all combinations of one or more of the associated listed items. No language in the specification should be construed as indicating any non-claimed subject matter as essential to the practice of the claimed subject matter.

It is to be appreciated that reference to "one example" or "an example" of the invention, or similar exemplary language (e.g., "such as") herein, is not made in an exclusive sense. Various substantially and specifically practical and useful exemplary embodiments of the claimed subject matter are described herein, textually and/or graphically, for carrying out the claimed subject matter.

Accordingly, one example may exemplify certain aspects of the invention, whilst other aspects are exemplified in a different example. These examples are intended to assist the skilled person in performing the invention and are not intended to limit the overall scope of the invention in any way unless the context clearly indicates otherwise. Variations (e.g. modifications and/or enhancements) of one or more embodiments described herein might become apparent to those of ordinary skill in the art upon reading this application. The inventor(s) expects skilled artisans to employ such variations as appropriate, and the inventor(s) intends for the claimed subject matter to be practiced other than as specifically described herein.

Any method steps, processes, and operations described herein are not to be construed as necessarily requiring their performance in the particular order discussed or illustrated, unless specifically identified as an order of performance. It is also to be understood that additional or alternative steps may be employed.

The invention claimed is:

1. Electrical protection apparatus for mobile machinery, said apparatus comprising:
   a sensor configured for operative fitment to a portion of the machinery operable near an electrical conductor and to generate a signal via electromagnetic induction from electricity in the conductor;
   a signal isolator configured to electrically isolate the sensor;
   an indicator configured to indicate when the signal reaches and/or exceeds a predetermined threshold; and
   a controller arranged in signal communication with the isolator and operatively interfaced with a control system of the machinery, the controller configured to monitor the signal and to:
   i) record a log of movement commands executed by the control system;
   ii) if the signal reaches a predetermined threshold, override the control system so that the portion of the machinery is only maneuverable to reduce the signal below the predetermined threshold;
   iii) if the signal exceeds the predetermined threshold, override the control system and execute the most recent movement commands in reverse to automatically maneuver the portion of the machinery away from the conductor; and
   iv) if the signal reaches and/or exceeds the predetermined threshold, activate the indicator.

2. Apparatus of claim 1, wherein the sensor is configured for operative fitment to a portion of the machinery by comprising a suitable waveguide for attachment along a length of the portion and/or the waveguide comprises the portion of the machinery.

3. Apparatus of claim 1, wherein the sensor includes a filtering circuit to generate the signal based on electromagnetic induction in a frequency range of 45 Hz to 65 Hz to minimise electromagnetic induction interference in other frequency ranges.

4. Apparatus of claim 1, wherein the indicator comprises a visual indicator for providing a visual indication of the alarm condition and/or an audio indicator for providing an audible indication of the alarm condition.

5. Apparatus of claim 1, wherein the indicator is configured to provide a graded indication of the alarm condition said alarm condition graded from a caution state to a warning state and a critical state, each state determined by the signal's relationship to the predetermined threshold.

6. Apparatus of claim 1, wherein the controller comprises a network interface operatively configured to transmit an alarm signal via a communications network if the signal reaches and/or exceeds the predetermined threshold.

7. Apparatus of claim 1, wherein the controller is programmable to configure the predetermined threshold.

8. Apparatus of claim 1, which includes and/or is configured to communicate with a wireless status monitor which is configured to provide remote indication on an operational status of said apparatus, the status monitor configured to interface with the controller to allow remote maneuvering of the portion of the machinery.

9. Mobile machinery having a portion operable near an electrical conductor, said machinery comprising:
   a sensor configured for operative fitment to a portion of the machinery operable near an electrical conductor and to generate a signal via electromagnetic induction from electricity in the conductor;
   a signal isolator configured to electrically isolate the sensor;
   an indicator configured to indicate when the signal reaches and/or exceeds a predetermined threshold; and
   a controller arranged in signal communication with the isolator and operatively interfaced with a control system of the machinery, the controller configured to monitor the signal and to:
   i) record a log of movement commands executed by the control system;
   ii) if the signal reaches a predetermined threshold, override the control system so that the portion of the machinery is only maneuverable to reduce the signal below the predetermined threshold;
   iii) if the signal exceeds the predetermined threshold, override the control system and execute the most recent movement commands in reverse to automatically maneuver the portion of the machinery away from the conductor; and
   iv) if the signal reaches and/or exceeds the predetermined threshold, activate the indicator.

10. Mobile machinery of claim 9, wherein the portion operable near the conductor is selected from a group consisting of a ground engaging tool, an elevated work platform, and a boom.

11. Mobile machinery of claim 9, wherein the sensor includes a filtering circuit to generate the signal based on electromagnetic induction in a frequency range of 45 Hz to 65 Hz to minimise electromagnetic induction interference in other frequency ranges.

12. Mobile machinery of claim 9, wherein the indicator comprises a visual indicator for providing a visual indication of the alarm condition and/or an audio indicator for providing an audible indication of the alarm condition.

13. Mobile machinery of claim 9, wherein the indicator is configured to provide a graded indication of the alarm condition, said alarm condition graded from a caution state to a warning state and a critical state, each state determined by the signal's relationship to the predetermined threshold.

14. Mobile machinery of claim 9, wherein the controller comprises a network interface operatively configured to transmit an alarm signal via a communications network if the signal reaches and/or exceeds the predetermined threshold.

15. Mobile machinery of claim 9, wherein the controller is programmable to configure the predetermined threshold.

16. Mobile machinery of claim 9, wherein the controller includes and/or is configured to communicate with a wireless status monitor which is configured to provide remote indication on an operational status of said mobile machinery the status monitor configured to interface with the controller to allow remote maneuvering of the portion of the machinery.

17. A method for operating mobile machinery, said method comprising the steps of:
   generating a signal via a sensor configured for operative fitment to a portion of the machinery operable near an electrical conductor, said signal generated via electromagnetic induction from electricity in the conductor; and
   via a controller operatively interfaced with a control system of the machinery:
   i) monitoring the signal and recording a log of movement commands executed by the control system;
   ii) if the signal reaches a predetermined threshold, overriding the control system so that the portion of the machinery is only maneuverable to reduce the signal below the predetermined threshold; and
   iii) if the signal exceeds the predetermined threshold, overriding the control system and executing the most recent movement commands in reverse to automatically maneuver the portion of the machinery away from the conductor.

18. The method of claim 17, which includes the step of, via the controller, activating an indicator configured to indicate when the signal reaches and/or exceeds a predetermined threshold.

19. The method of claim 17, which includes the step of, via the controller, transmitting an alarm signal via a communications network if the signal reaches and/or exceeds the predetermined threshold.

* * * * *